United States Patent

Nicholson et al.

[11] Patent Number: 5,808,322
[45] Date of Patent: Sep. 15, 1998

[54] FASTER SWITCHING GAAS FET SWITCHES BY ILLUMINATION WITH HIGH INTENSITY LIGHT

[75] Inventors: Dean B. Nicholson, Windsor; Eric R. Ehlers, Santa Rosa, both of Calif.

[73] Assignee: Hewlett-Packard Company, Palo Alto, Calif.

[21] Appl. No.: 829,924

[22] Filed: Apr. 1, 1997

[51] Int. Cl.⁶ .......................... H01L 27/15; H01L 31/12; H01L 33/00
[52] U.S. Cl. .................. 257/80; 257/81; 257/82; 257/99; 257/433; 257/434; 257/680
[58] Field of Search .................... 257/433, 434, 257/680, 81, 80, 82, 99

[56] References Cited

U.S. PATENT DOCUMENTS

| 3,043,958 | 7/1962 | Diemer ........................................ 257/82 |
| 3,370,174 | 2/1968 | Toussaint ................................... 257/82 |

FOREIGN PATENT DOCUMENTS

| 54-57983 | 5/1979 | Japan ........................................ 257/82 |
| 4139877 | 5/1992 | Japan . |
| 5226688 | 9/1993 | Japan ........................................ 257/82 |

OTHER PUBLICATIONS

Gate Slow Transients In GaAs Mesfets–Causes, Cures, and Impact on Circuits R. Yeats, D.C. D'Avanzo, K. Chan, N. Fernandez, T.W. Taylor, and C. Vogel Copywrite 1988 IEEE pp. 842–845–IEDM 88.

*Primary Examiner*—William Mintel
*Attorney, Agent, or Firm*—Deborah A. Neville

[57] ABSTRACT

The present invention relates to GaAs FET switches for use in microwave test equipment. For many microwave applications, particularly GSM (Global System for Mobile Telecommunications) basestation testing, accurate, reliable switching of microwave signals is desirable. GaAs FET switches are widely used to switch microwave signals in many applications because of their small size and high reliability. However, GaAs FET switches have a significant drawback called the "slow tail" effect. This effect causes the final amplitude of the microwave signal to only be reached gradually after a 10 to 20 millisecond interval. The present invention integrates high intensity LEDs above GaAs IC switches to decrease the absolute magnitude of the slow tail effect, and to shorten its length for faster, more accurate switching.

11 Claims, 9 Drawing Sheets

FASTER SWITCHING GAAS FET SWITCHES BY ILLUMINATION WITH HIGH INTENSITY LIGHT

CROSS REFERENCE TO RELATED APPLICATIONS

The present application is related to patent application entitled A PIN ARRAY SOLUTION FOR MICROWAVE MULTI-CHIP MODULES, Ser. No. 08/629,949, filed Apr. 12, 1996, and assigned to the Hewlett Packard Company, the same assignee as the present application.

BACKGROUND OF THE INVENTION

The present invention relates to Gallium Arsenide (GaAs) Field Effect Transistor (FET) switches for use, for example, in microwave test equipment.

Microwave test equipment has traditionally used mechanically switched step attenuators to set the output level of sources and network analyzers. These switches were very low loss, but they had drawbacks in terms of switching speed (on the order of 30 milliseconds), size, and reliability. In an effort to make a smaller, more reliable step attenuator, GaAs FET IC (Integrated Circuit) switches have been used to switch in and out attenuator segments to form a step attenuator.

Figure 1:
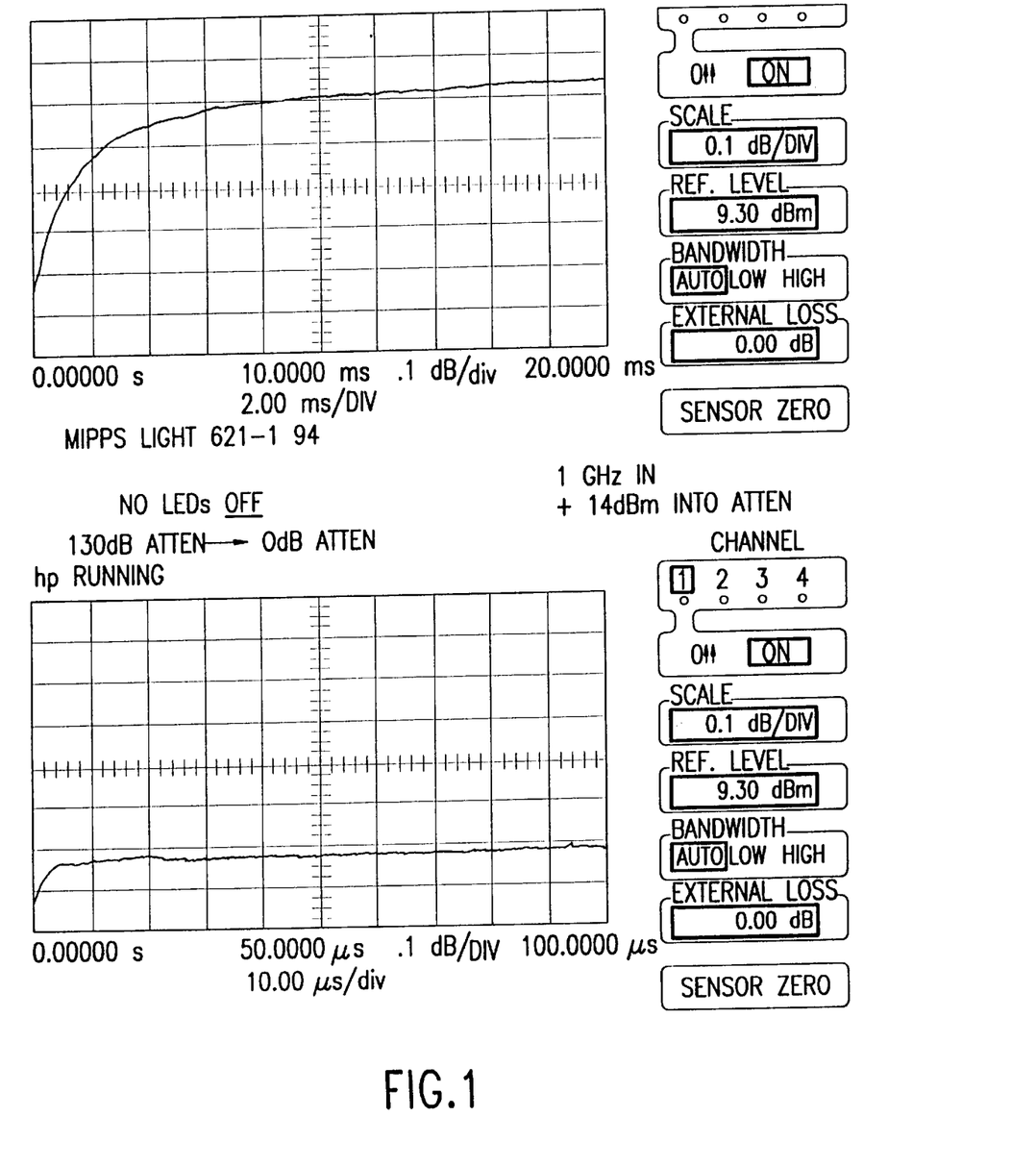
FIG. 1 shows the slow tail effect from GaAs FET IC switches.

While the benefits of smaller size, and greater reliability have been obtained, GaAs FET based IC microwave switches continue to have what is known as the "slow tail effect" which causes the amplitude of the switched microwave signal to only gradually come to its final value after a period of 15 to 20 milliseconds after the switch is turned to the ON state, such as shown in FIG. 1. The explanation usually given for this effect is that traps in the GaAs caused by the exposed GaAs surface in a FET structure have a time constant on the order of milliseconds. The number and time constants of these traps are extremely dependent on the GaAs wafer processing, and can vary from less than one millisecond to much greater in a fairly unpredictable manner, even between wafers processed through the same process but at different times.

When the FET is turned to the OFF state, the channel under the FET gate is depleted of electrons, and each trap has a high probability of having a captured electron with it. When the FET is turned ON, the Fermi level shifts and the electrons captured by the traps are released and enter the channel along with the electrons attracted from the standard donor atoms. However, due to the fact that the traps release their electrons with a time constant on the order of milliseconds, the electron contribution from the traps to the channel does not reach equilibrium until 10 to 20 milliseconds after switching has occurred. Thus, the conductivity of the FET channel, and hence the attenuation of the microwave signal passing through the FET channel are not stable until 10 to 20 milliseconds after switching.

The traps involved in slow tails are due mainly to the influence of the surface region around the gate, as described for example in R. Yeats et al, "Gate Slow Transients in GaAs MESFETS—Causes, Cures, and Impact on Circuits", 1988 IEDM Conference Proceedings, pp 842–845. Slow tails can be minimized at the device level by making the recess in the GaAs for the gate tighter and/or by using moderate to high doping near the edges of the gate. Unfortunately, both of these techniques are detrimental to the power handling capability of the GaAs FET. Since it is desirable to have high output powers from microwave test equipment sources, degrading the power handling capability of the switches on the output step attenuator of the instrument is undesirable.

SUMMARY OF THE INVENTION

In view of the foregoing, it is an object of the present invention to provide an improved GaAs FET switch for use in microwave test equipment and more particularly a faster switching GaAs FET switch by illumination with high intensity light.

According to one preferred embodiment, the present invention provides an improved step attenuator package which comprises a GaAs FET IC switch arrangement including a plurality of GaAs FET IC switches, which would normally exhibit a slow tail effect when in operation, in combination with a plurality of light sources (LEDs) located within the step attenuator package where each of the light sources corresponds to a respective one of the GaAs switches and has a sufficient light intensity for illuminating the respective GaAs switch during operation so as to reduce or minimize the slow tail effect.

As will be described in detail below, by eliminating or minimizing the effects of traps on the performance of GaAs FET IC switches, the advantages of reliability and compactness are preserved, while eliminating the drawback of slow settling on the output amplitude.

It is a well known phenomena that shining a light on GaAs FETs affects their slow tails. In fact, some tests on GaAs ICs are actually done in darkened chambers to give accurate correlation with the performance of the IC in its final sealed, dark package. By shining a very bright light on the GaAs FET IC switches used in the step attenuator for a microwave source, it has been found that there is a very marked and repeatable reduction in the slow tail effect for these switches. The degree of slow tail reduction in the output of the GaAs FET IC switches is proportional to the strength of the light illuminating those switches, and a bright light is required to give good results.

Integrating a high power incandescent light into a microwave package is not feasible, and trying to run light pipes from a high power light source to the GaAs IC chips would be difficult and expensive. With the recent advent of extremely bright and efficient LEDs (called super-bright LEDs) based on AlInGaP and AlGaAs, a light source can be provided which is small enough to integrate on top of a microwave package with a light source bright enough to greatly reduce the GaAs slow tail effect.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the following detailed description, serve to explain the principles of the invention:

FIG. 6 shows a view of the slow tail effect of the step attenuator of FIG. 2 with the LEDs ON.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Referring now to FIG. 1, the slow tail effect from GaAs FET IC switches is shown. GaAs FET based IC microwave switches exhibit what has been described above as the "slow tail effect" which causes the amplitude of the switched microwave signal to only gradually come to its final value after a period of 15 to 20 milliseconds after the switch is turned ON, such as shown in FIG. 1. As also previously described, by eliminating or minimizing the effects of traps on the performance of GaAs FET IC switches, the advantages of reliability and compactness are preserved, while eliminating the drawback of slow settling on the output amplitude. It is a well known phenomena that shining a light on GaAs FET switches affects their slow tails. In fact, some tests on GaAs FET IC switches are actually performed in darkened chambers to give accurate correlation with the performance of the IC switch in its final sealed, dark package.

By shining a very bright light on the GaAs FET IC switches used in the step attenuator for a microwave source, it has been found that there is a very marked and repeatable reduction in the slow tail effect for GaAs FET switches. The degree of slow tail reduction in the output of the GaAs FET IC switches is proportional to the strength of the light illuminating the switches, and a bright light is required to give good results. Integrating a high power incandescent light into a microwave package is presently not feasible, and trying to run light pipes from a high power light source to the GaAs IC switches would be difficult and expensive. With the recent advent of extremely bright and efficient LEDs (called super-bright LEDs) based on AlInGaP and AlGaAs, there now availabes a light source small enough to be integrated on top of a microwave package with a light source bright enough to greatly reduce the GaAs slow tail effect described above.

Figure 2:
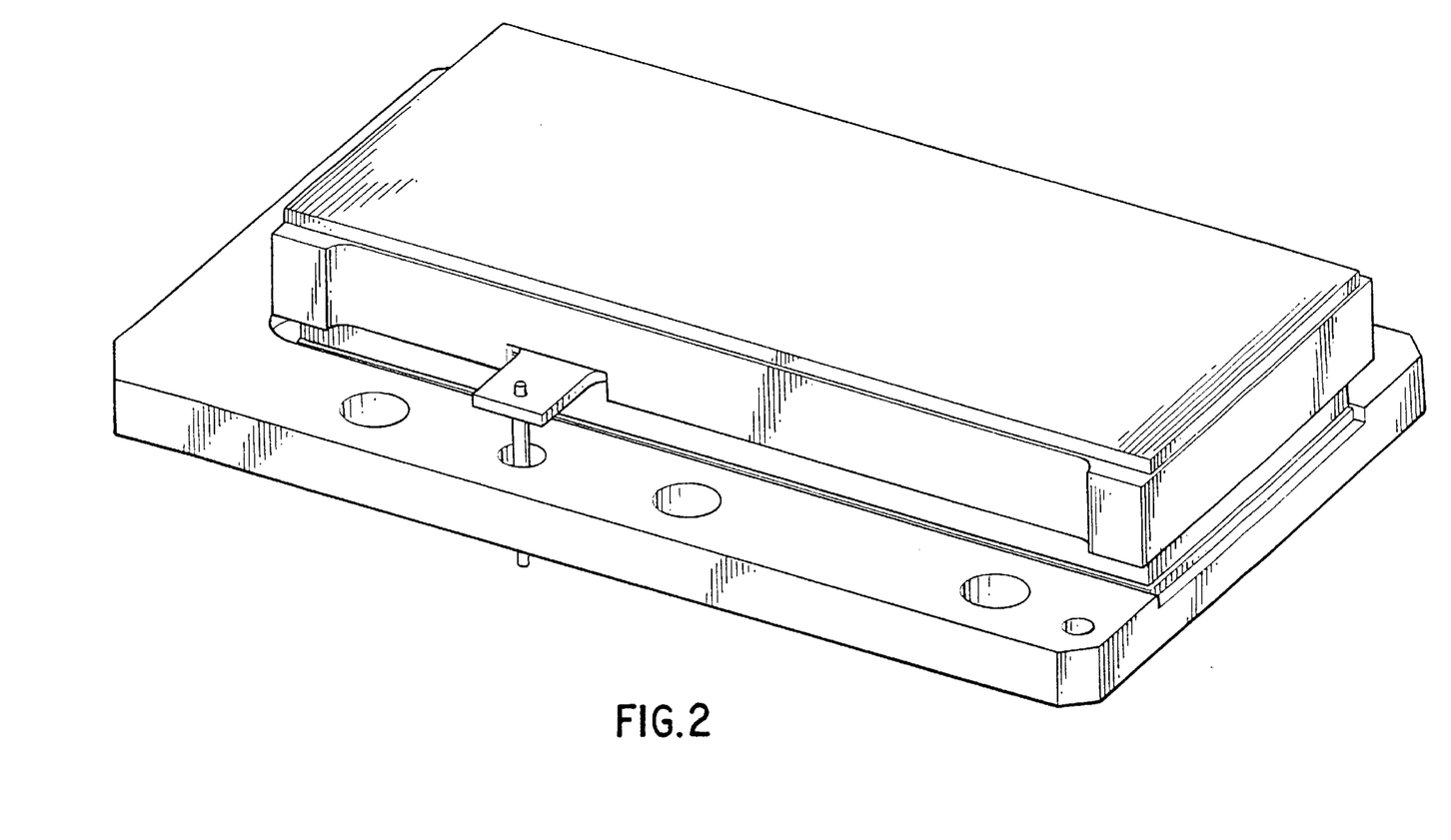
FIG. 2 shows an assembled GaAs FET IC 130 dB step attenuator package with LEDs according to the present invention.
Figure 3A:
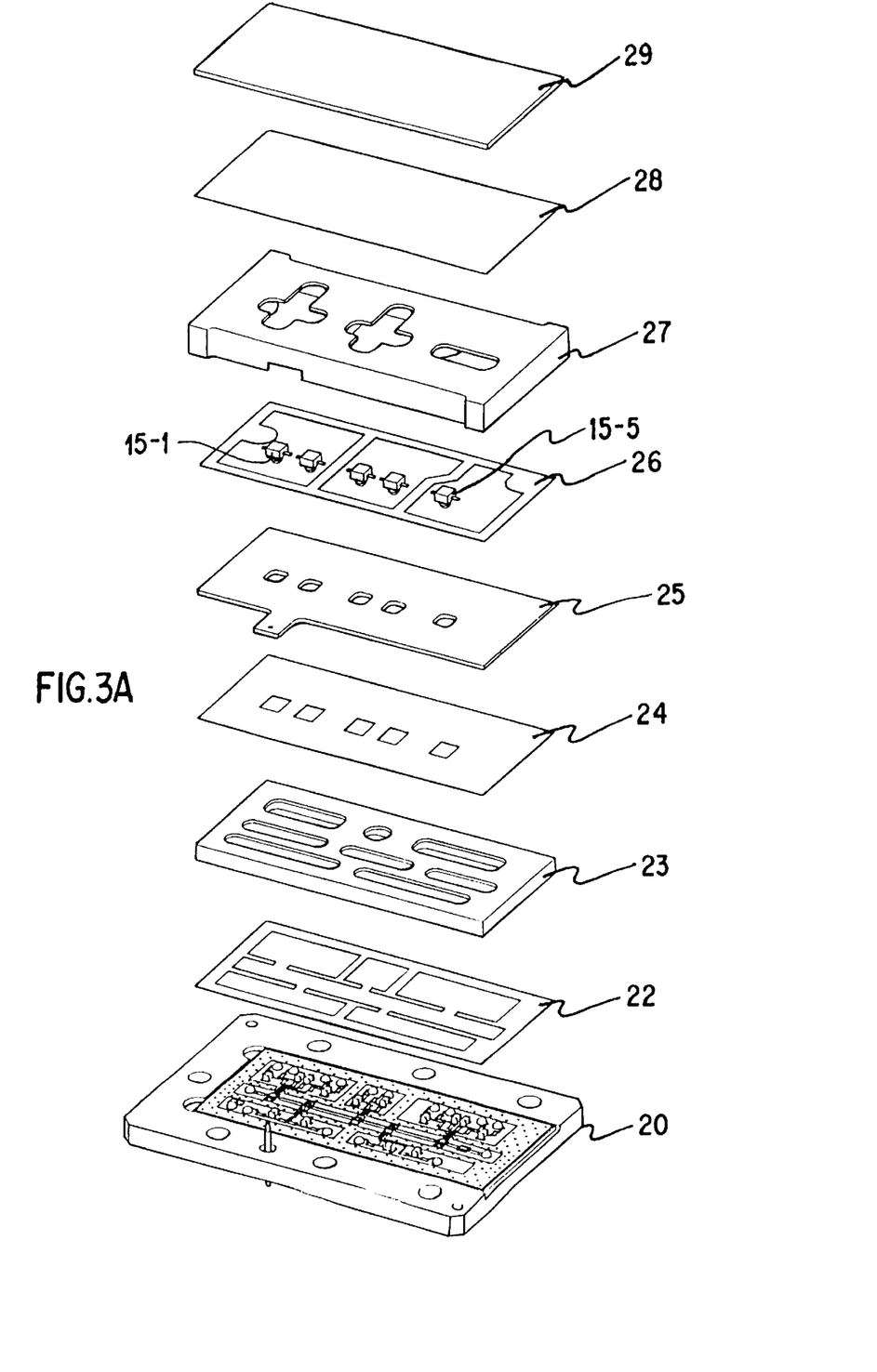
FIG. 3A shows an exploded view an the GaAs FET IC step attenuator of FIG. 2 according to the present invention.
Figure 4:
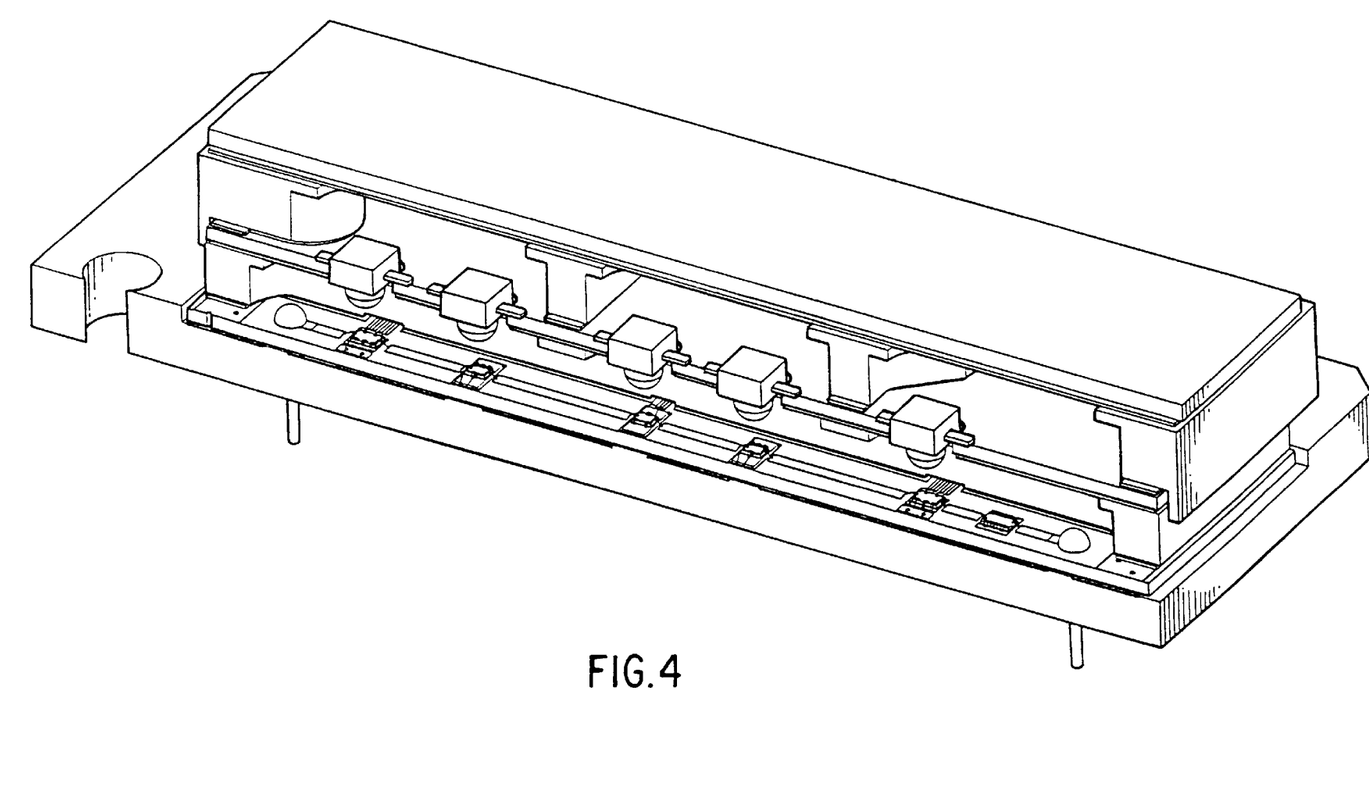
FIG. 4 shows a cutaway view of the GaAs FET IC step attenuator of FIG. 2.

FIG. 2 shows an assembled GaAs FET IC 130 dB step attenuator package 10 with LEDs 15 according to the present invention, FIG. 3A shows an exploded view an the GaAs FET IC step attenuator 10 of FIG. 2, and FIG. 4 shows a cutaway view of the GaAs FET IC step attenuator 10 of FIG. 2.

In FIG. 3A, the GaAs FET IC 130 dB step attenuator 10 comprises a GaAs switch arrangement which includes a base circuit 20 which further includes or contains a plurality of gallium arsenide switches 21 (shown in better view in FIG. 4). In one preferred embodiment, the step attenuator of FIG. 4 includes five GaAs switches 21 (21-1; 21-2; 21-3; 21-4; and 21-5).

In FIG. 3A, some of the components of the exploded view of the step attenuator 10 are similar or analogous to those described in the above cross-referenced patent application entitled "A Pin Grid Array Solution for Microwave Multichip Modules", which is assigned to the same assignee (the Hewlett-Packard Company), and the details of which are hereby incorporated by reference. However, for clarity purposes, a brief description of the functional components of the step attenuator package 10, and particularly the operation of the GaAs switch arrangement of FIG. 3A will now be described.

The step attenuator 10 of FIG. 3A and particularly the GaAs switch arrangement shows the base circuit 20 containing the GaAs FET IC switches 21 with a lid preform 22 that contains silicone-encapsulant. Lid preform 22 is a conductive epoxy preform that attaches the lid 23 to the ceramic circuit, which is typically made of alumina. Conductive epoxy preform 24 is placed on top of lid 23. Preform 24 attaches PC board 25 to the bottom lid 23. PC board 25 includes a plurality of super-bright LEDs 15. In one preferred embodiment, five LEDs 15 are used, which correspond to the five GaAs switches 21.

In FIG. 3A, the LEDs 15 are shown separated from PC board 25. In one preferred embodiment, there are five LED's 15 (15-1; 15-2; 15-3; 15-4; 15-5), one for each gallium arsenide IC switch of circuit 21 (21-1; 21-2; 21-3; 21-4; 21-5). When used, the LEDs 15 are attached to the PC board 25, but are shown separated in FIG. 3A, for clarity purposes.

Figure 3B:
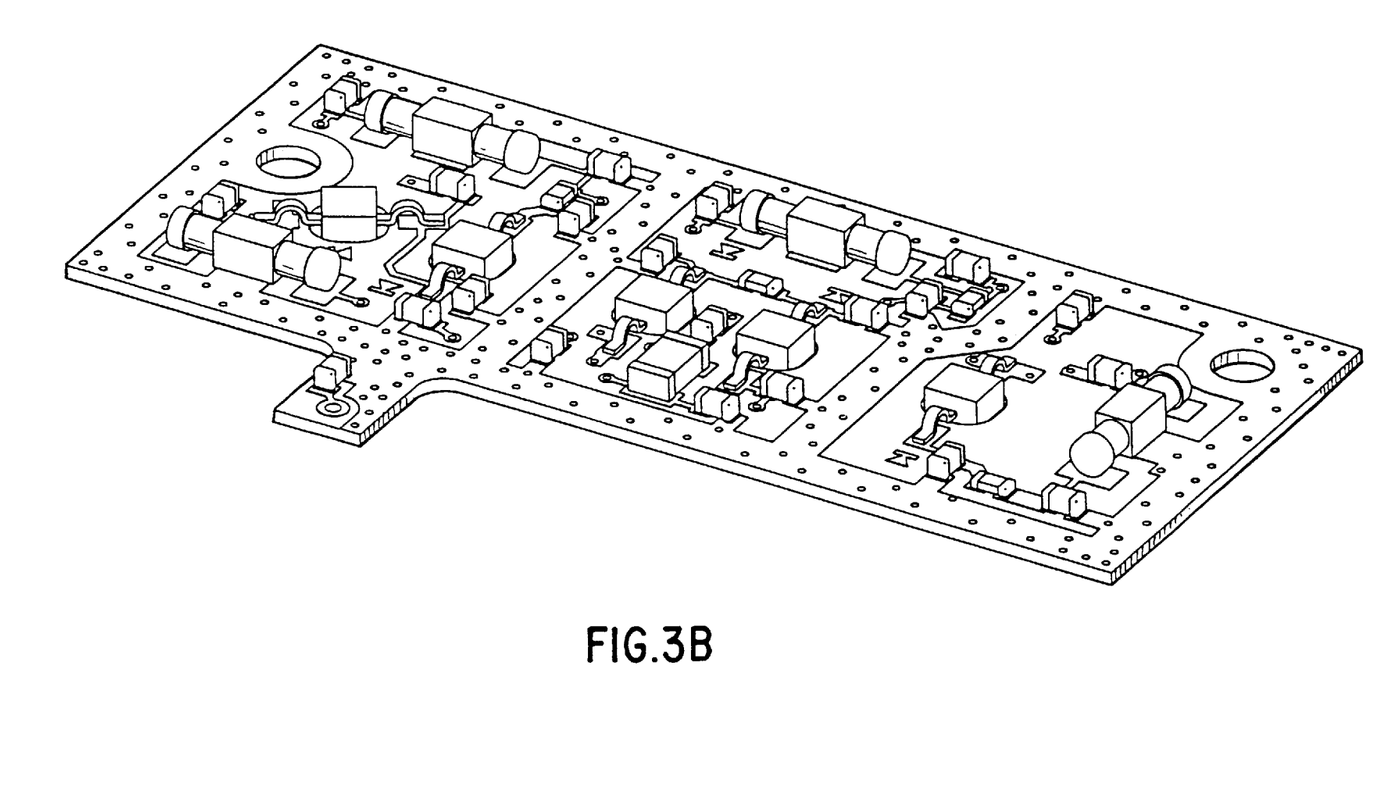
FIG. 3B shows a perspective view of a PC board which forms a portion of FIG. 3A.

The super-bright LEDs 15 include biasing and decoupling circuitry (shown in FIG. 3B), which prevents microwave energy from propagating through the LEDs 15 to the output. As is known in the art, in microwave attenuators where high attenuation is needed, it is important that microwave energy is not coupled from the input side of the device to the output side. As shown in FIG. 3B, the PC board 25 includes LEDs 15, and in addition includes capacitors, ferrites and resistors arranged in a normal fashion as to eliminate the feedthrough down to extremely low levels, so as to provide a clean output signal with very little ripple.

In FIG. 3A, PC board 25 is attached with a PC board conductive epoxy preform 26 to middle lid 27. Middle lid 27 is used as a container so that the upper region can be silicone encapsulated to prevent moisture from degrading the performance and causing silver migration, which allows the device operate safely in extremely humid environments.

Conductive epoxy preform 28 is used to attach the top lid 29 to middle lid 27, and serves to keep out stray RF signals from coming in and keep RF signals from propagating out and causing interference in other regions of the microwave instrument.

In FIG. 3A, the GaAs switches 21 on the IC are set to form a low insertion loss "thru" path, called the 0 dB state. In another state, the GaAs switches on the IC switch in a higher insertion loss state. The high insertion loss can be defined in dB increments (e.g., 10 dB, 20 dB, 40 dB) in which different levels of attenuation can be switched in an out. In one preferred embodiment, the step attenuator 10 of FIG. 3A comprises a 130 dB step attenuator which can be in any state of attenuation in five dB steps or increments between zero and 130 dB, by switching in and out the various segments (or GaAs switches 21).

As described above, a problem that arises is that gallium arsenide switches exhibit what is called the slow tail effect.

When switched between the OFF state to the ON state, the step attenuator does not reach full conductivity in the FET channel in the ON state for typically 10–20 milliseconds. The insertion loss through the device slowly changes before reaching the equilibrium value, as shown in FIG. 1. This settling time causes unwanted delays, especially for modulation standards that should be switched and settled within, say, 20 microseconds.

It is known in the prior art that light affects gallium arsenide traps, and that such traps are known to cause the slow tail effects. The prior art approach is that light has been shined on gallium arsenide switches such that it changes the slow-tail effect. The prior art has reported changes; but these have been anecdotal only, with no one reporting a systematic improvement in reducing slow tails using illumination. Applicant has found that shining light on GaAs switches, the photons will empty the traps of electrons, such that the traps no longer play a role in the slow-tail effect.

By shining a very bright light on a GaAs IC switch, it has been found that the slow tail effect improves markedly such that the slow tails effect went away by a factor of about a hundredfold faster than in prior art approaches. The magnitude of the slow tail effect for a 5 or 10 microsecond time interval may be improved by a factor of two, but the point in time at which the slow tail effect disappeared to within 0.018 dB improved by a factor of about 100.

According to one embodiment of the present invention, a sufficiently bright light source, such as a super-bright LED is integrated with the GaAs switch arrangement to form a step attenuator package which improves the slow tail effect described above and still maintain a low-cost package. Super-bright LEDs are presently now available, such as from the Hewlett-Packard Company. The effect with super-bright LEDs is intensity dependent—the brighter the light, the more the slow tail effect goes away.

In one preferred embodiment, the preferred intensity level of the super-bright LEDs 15 of FIGS. 3A and 4 is rated at approximately 500 millicandles, with a half-angle of 28 degrees. The miniaturized high-intensity LEDs 15 in FIG. 3A are able to shine enough light directly over the GaAs switches 21 to minimize or in some instances eliminate the slow tail effect. The present invention is believed to be suitable with super-bright LEDs with a light intensity of approximately 500 millicandles at a 28 half-degree angle of light output and where each LED 15 is positioned or located at a certain distance above the corresponding GaAs IC switch 21. In one preferred embodiment, the preferred distance between each LED 15 and the corresponding GaAs IC switch 21 is 3 to 3½ millimeters, as a typical example.

A clear silicone encapsulant surrounds the package so that the package is moisture resistant. Also, the package is designed with the clear silicone encapsulant and reflective metal surfaces so as to take advantage of reflected light (typically, all the metal surfaces are gold plated). By the choice of a clear silicone encapsulant, the ability to use LEDS is preserved. If dark-colored encapsulant or an opaque encapsulant is used, the use of the LEDs is no longer possible.

Step attenuators are made with fixed resistors that are switched in and out with gallium arsenide switches which have rapid response times between the OFF state to the ON state. There is a time transition from high-impedance to low-impedance states, and the use of integrated super-bright LEDS accelerates the response time. With step attenuators, the GaAs FET switches 21 control the switching in and out the resistors, and the use of the super-bright LEDs 15 shining permanently on the GaAs FET switches 21 has a very beneficial effect on the response time.

In FIG. 4, there is a single LED 15 positioned directly over each gallium arsenide IC switch 21. In addition, the GaAs IC switches 21 are all bathed in reflected light from all of the different LEDs 15. If one LED 15 fails (say LED 15-2), the corresponding GaAs IC switch 21-2 that was being illuminated does not go back to its worst-case operating condition. Instead; GaAS IC switch 21-2 exhibits a graceful degradation mode, which would not be the case if only a single light source were used (which would result in failure). The redundancy aspect of five LEDs 15 placed directly over the GaAs switches 21 avoids the problems involved if a single light source goes out, and the very small LEDs allows the light source to be placed very close to the circuits. Hence, according to another feature of the present invention, with a plurality of LEDs 15, the failure of one LED would not affect the slow-tails performance as much as if there were no illumination at all.

The light sources utilized with the present invention are desirably of a sufficiently small size (such as super-bright LEDs 15) in order to keep the compactness of the original small package structure, and also in order to provide shielding between various segments of the circuit. For example, the use an incandescent light will generate a large amount of heat, which would require heat sinks because of overheating problems, whereas LEDs 15 are cooler, and provide DC current efficiency; so that a large power supply is not needed for the device.

The redundancy aspect of five LEDs 15 placed directly over the GaAs switches 21 avoids the problems involved if a single light source goes out, and the very small LEDs allows the light source to be placed very close to the circuits.

By integrating miniature high power LEDs 15 over the GaAs FET IC switches 21 shown in FIGS. 3A and 4, a compact, inexpensive module can be achieved that has a reduced "slow tails" effect, has the same length and width as a module with no LEDs, and is only about 4 mm taller.

Figure 5:
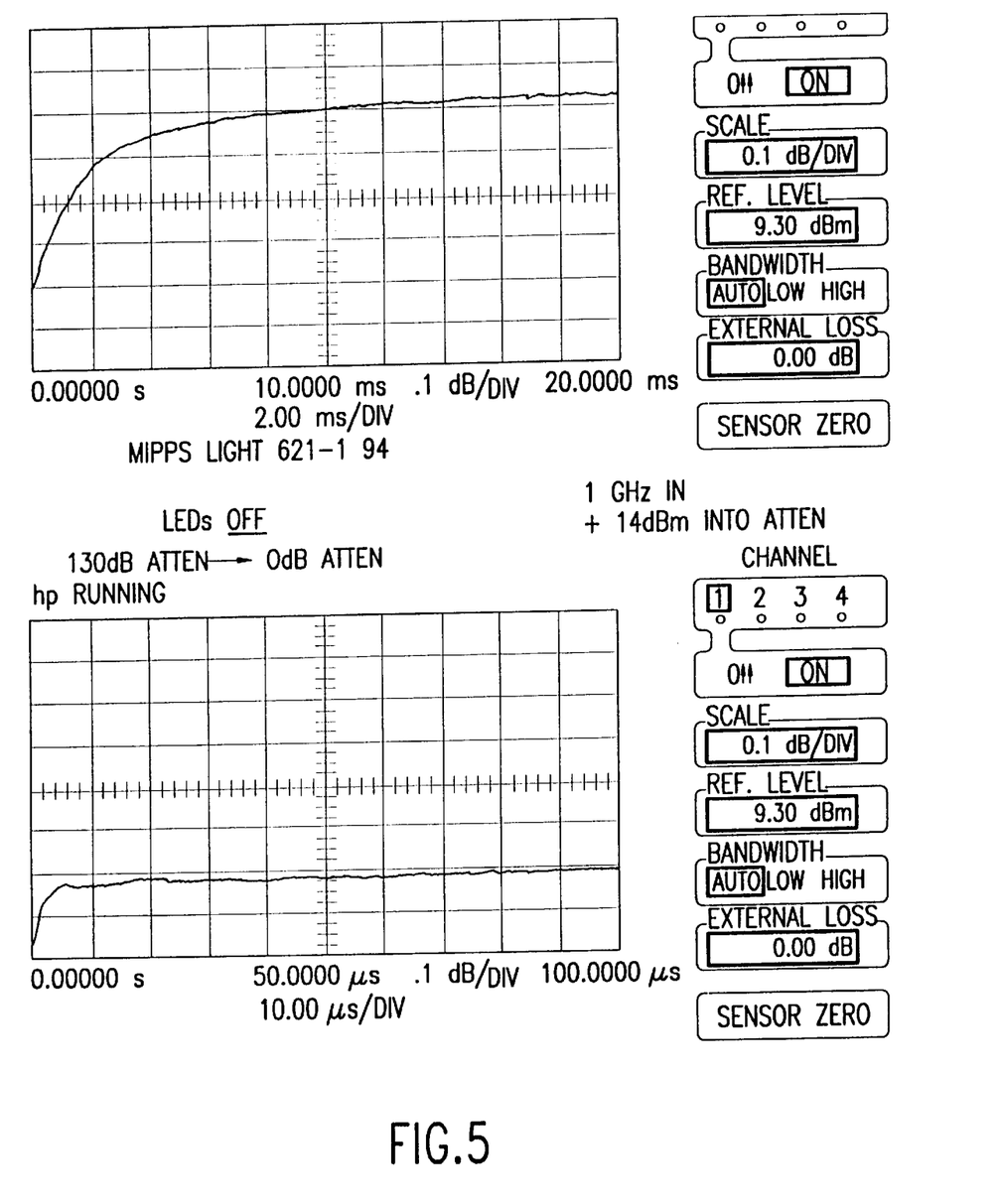
FIG. 5 shows a view of the slow tail effect of the step attenuator of FIG. 2 with the LEDs OFF.

FIG. 5 shows the response of the GaAs FET IC switched 130 dB step attenuator 10 with all the sections being switched simultaneously (going from the 130 dB attenuation state to the 0 dB attenuation state) and with the LEDs 15 (which are mounted over the corresponding switch 21) turned OFF. It can be seen that the amplitude of the signal is still increasing at 20 milliseconds (near the end of the plot of FIG. 5).

Figure 6:
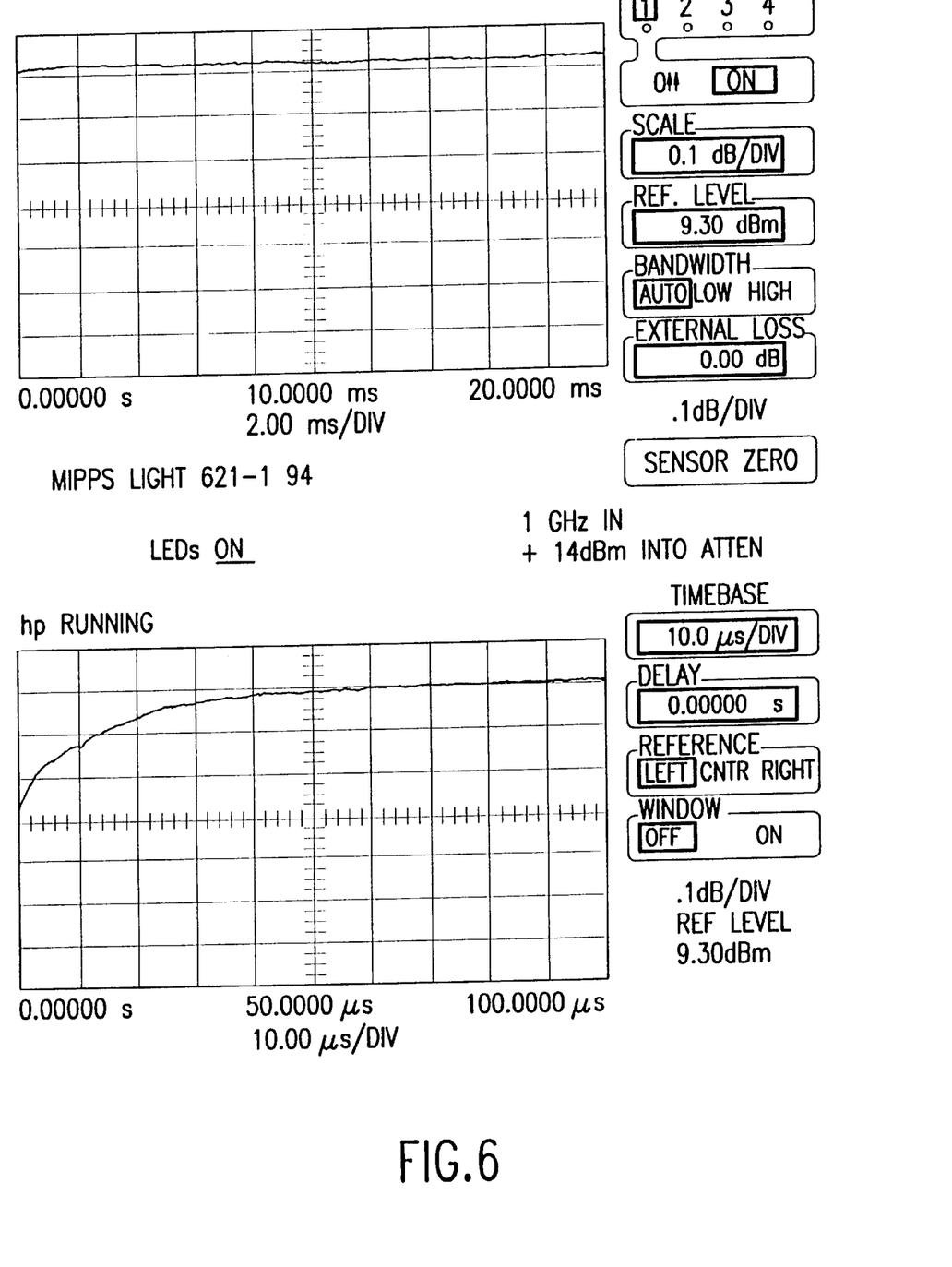

FIG. 6 shows a view of the slow tail effect of the step attenuator 10 of FIG. 2 with the LEDs 21 turned ON.

Figure 7:
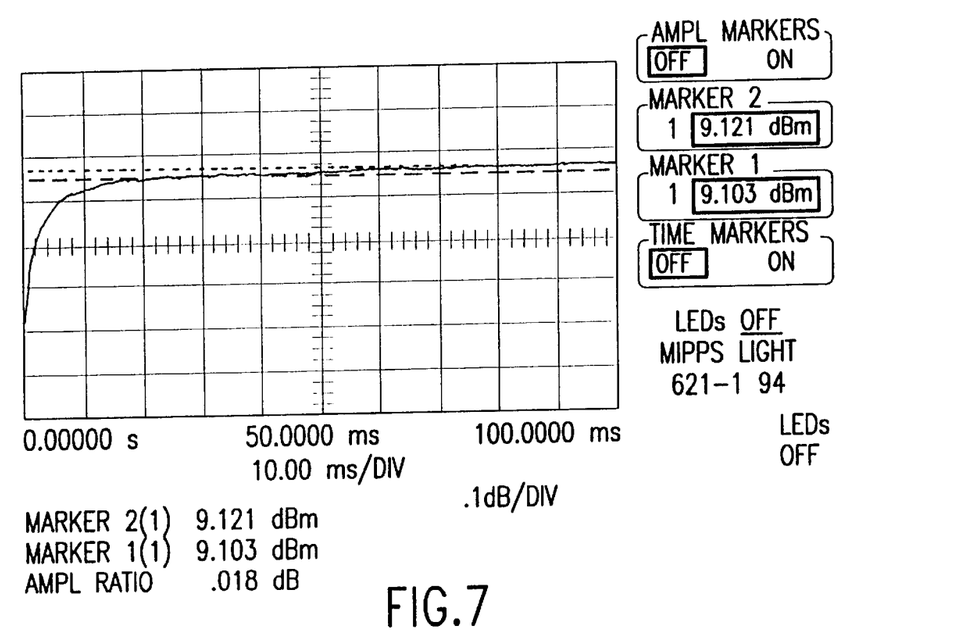
FIG. 7 the same view as in FIG. 5 with the time scale lengthened to 100 milliseconds.

FIG. 7 shows the same measurement but with the time scale lengthened to 100 milliseconds. It can be seen that the output amplitude of the signal does not stabilize until about 70 to 80 milliseconds from the switching event (t=0). If a time is picked at which the output amplitude is settled to within 0.018 dB of its final amplitude value, then this number will be 22 milliseconds for the step attenuator 10 with the LEDs turned OFF, as shown in FIG. 7.

Figure 8A:
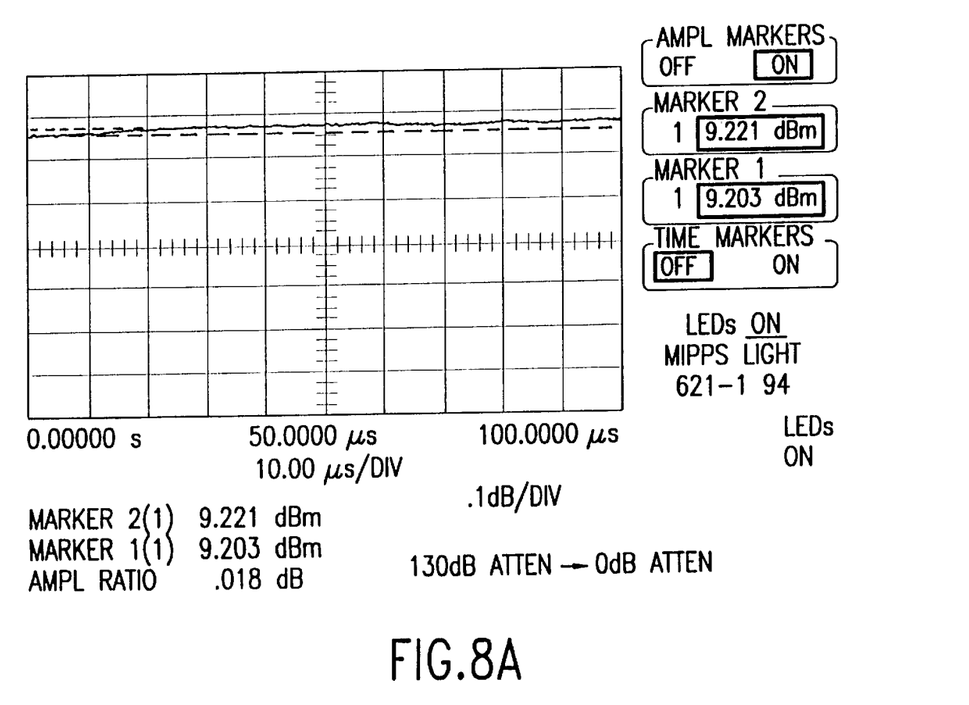
FIGS. 8A and 8B show a view of the slow tail effect of the step attenuator of FIG. 2 with the LEDs turned ON where the step attenuator settles to within 0.018 dB of its final amplitude value in 120 microseconds.
Figure 8B:
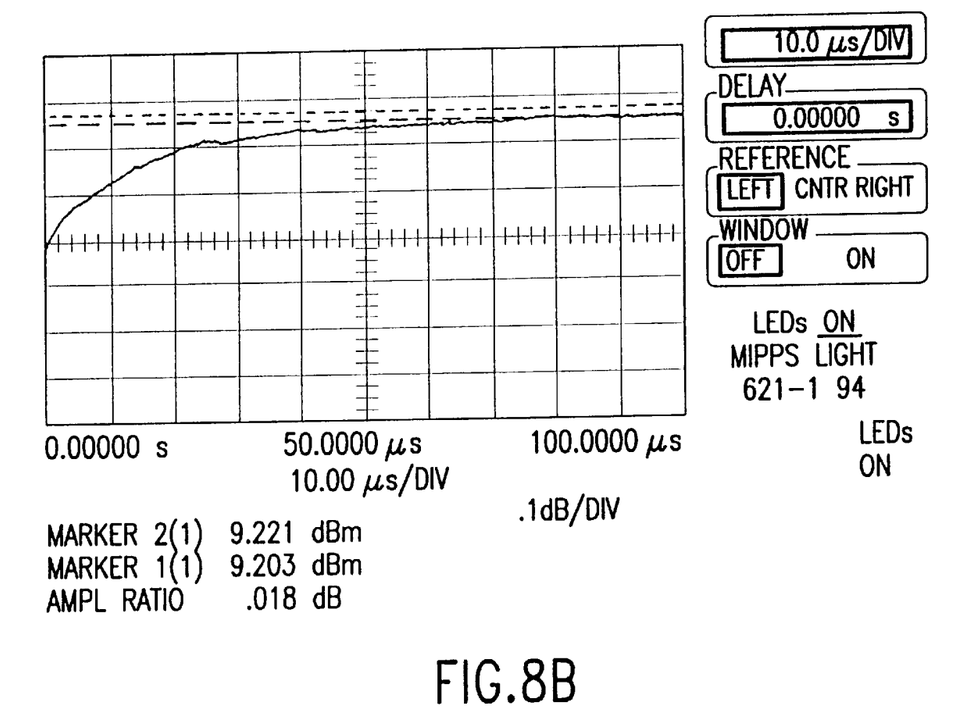

By contrast, with the LEDs turned ON, the same step attenuator 10 settles to within 0.018 dB in 120 microseconds, as shown in FIGS. 8A and 8B. The amplitude settling time of the step attenuator 10 has thus been speeded up by a factor of 183. In addition, the initial magnitude of the slow tail (this is measured at t=5 microseconds after switching) has been reduced from 0.45 dB with the LEDs 15 turned OFF to 0.2 dB with the LEDs 15 turned ON.

As described above, a high intensity light can repeatably, and to a high degree, reduce the "slow tail" phenomena in GaAs FET based switches and step attenuators. This desirable aspect allows the output amplitude of a GaAs switch to settle to its final value much more rapidly. By utilizing miniature high power LEDs based on AlGaAs or AlInGaP, the "slow tail" phenomena of a packaged product containing GaAs FET based switches can be greatly reduced, while the size and cost of the package are not greatly increased.

For other applications of the present invention, the noise figures of some amplifiers has been lowered by shining the light directly on the amplifier, and having a bright-intensity light that produces very little heat that can be positioned directly over amplifier chips in a gallium arsenide IC would provide the benefit of lower noise and possibly higher gain. Also in travelling wave amplifiers made of gallium arsenide IC's, shining bright light directly on those has eliminated slow tail effects in switching transients when utilized in an on/off pulse mode. Also, high-intensity light shined on certain devices such as negative-resistance devices and varactors could improve the 1/F or phase-noise characteristics.

It is believed that base band noise of gallium arsenide amplifiers can be improved with the features of the present invention. Typically gallium arsenide amplifiers are not used at low frequencies because they have a very high [1/F] noise component, which means as the frequencies goes down, there is more noise on the signal. This noise is generally associated with at least some portions of the traps emptying and filling. If the traps are emptied by shining the light directly those traps, the photons eject the electrons. This noise component could be greatly improved and extend the utility of gallium arsenide amplifiers to lower frequencies.

Since the small tail effect is intensity-dependent, it is helpful to consider at what point is an LED bright enough in terms of illumination so as to provide the desired effect, as well as one that is beneficial for the cost for installing the LEDs. With less bright LED's, there might get a factor of five to ten improvement in switching speed, which may not be suitable to be utilized, for example, with certain technologies, such as the time division multiplexed markets for cellular telephones. Other light sources which may be suitable with the aspects of the present invention could be light fibers bringing light in from a remote location, and miniature lasers.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A step attenuator package comprising:
   a GaAs FET IC switch arrangement including a plurality of GaAs FET IC switches which exhibit a slow tail effect when in operation, and
   a plurality of light sources located within said step attenuator package, each of said light sources corresponding to a respective one of said GaAs switches and having a sufficient light intensity level for illuminating the respective GaAs switch during operation so as to reduce or minimize said slow tail effect.

2. The step attenuator package as in claim 1 wherein said light sources include LEDs.

3. The step attenuator as in claim 2 wherein said LEDs are super-bright LEDs.

4. The step attenuator as in claim 3 wherein the light intensity level is at least approximately 500 millicandles.

5. The step attenuator as in claim 4 including a clear encapsulant for covering said package so as to enable the illumination of said GaAs Switches by said super-bright LEDs.

6. The step attenuator as in claim 5 wherein said super-bright LEDs provide illumination for others of said GaAs switches if one of said LEDs fails in operation so as to reduce the degradation of the slow tail effect.

7. The step attenuator as in claim 6 wherein the distance between said GaAs switches and said LEDs is approximately 3–3½ millimeters.

8. The step attenuator as in claim 7 wherein the attenuation range of said step attenuator is approximately 130 dB.

9. The step attenuator as in claim 8 wherein the settling time of said step attenuator is approximately 120 microseconds.

10. A step attenuator package comprising:
    a GaAs FET IC switch arrangement including a plurality of GaAs FET IC switches, each of which exhibit a slow tail effect when in operation and not illuminated,
    a plurality of LEDs located within said step attenuator package, each one of said LEDs corresponding to a respective one of said GaAs switches and positioned approximately 3–3½ millimeters from the respective GaAs switch and having a sufficient light intensity level for illuminating the respective GaAs switch during operation so as to reduce or minimize said slow tail effect.

11. A step attenuator package comprising:
    a GaAs FET IC switch arrangement including one or more GaAs FET IC switches each of which normally exhibit a slow tail effect when in operation, and
    one or more LED light sources located within said step attenuator package, each of said LED light sources corresponding to a respective one of said GaAs switches and having a sufficient light intensity level for illuminating the respective GaAs switch during operation so as to reduce or minimize said slow tail effect.

* * * * *